(12) United States Patent
Koo

(10) Patent No.: US 7,782,078 B2
(45) Date of Patent: Aug. 24, 2010

(54) ON DIE TERMINATION CIRCUIT AND METHOD FOR CALIBRATING THE SAME

(75) Inventor: Cheul-Hee Koo, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/149,775

(22) Filed: May 8, 2008

(65) Prior Publication Data

US 2008/0284467 A1 Nov. 20, 2008

(30) Foreign Application Priority Data

May 14, 2007 (KR) .................. 10-2007-0046380

(51) Int. Cl.
*H03K 17/16* (2006.01)
*H03K 19/003* (2006.01)

(52) U.S. Cl. .................. 326/30; 326/87; 327/109; 327/112

(58) Field of Classification Search .................. 326/30, 326/82–83, 86–87; 327/108–109, 112
See application file for complete search history.

(56) References Cited

U.S. PATENT DOCUMENTS

| 6,064,224 | A | * | 5/2000 | Esch et al. ............. 326/30 |
| 6,674,302 | B2 | * | 1/2004 | Yen .................... 326/30 |
| 6,717,455 | B2 | * | 4/2004 | Mughal et al. ........... 327/378 |
| 6,937,055 | B2 | * | 8/2005 | Roy et al. .............. 326/30 |
| 6,958,613 | B2 | | 10/2005 | Braun et al. |
| 6,980,020 | B2 | * | 12/2005 | Best et al. ............. 326/30 |
| 7,148,721 | B2 | * | 12/2006 | Park .................... 326/30 |
| 7,151,390 | B2 | | 12/2006 | Nguyen et al. |
| 7,170,313 | B2 | | 1/2007 | Shin |
| 7,176,711 | B2 | | 2/2007 | Park et al. |
| 7,345,504 | B2 | * | 3/2008 | Lin et al. .............. 326/30 |

(Continued)

FOREIGN PATENT DOCUMENTS

JP 2005-285125 10/2005

(Continued)

OTHER PUBLICATIONS

Korean Notice of Allowance issued in Korean Patent Application No. KR 10-2007-0046380, dated Nov. 27, 2008.

*Primary Examiner*—James H. Cho
*Assistant Examiner*—Jason Crawford
(74) *Attorney, Agent, or Firm*—IP & T Law Firm PLC

(57) ABSTRACT

On die termination circuit and method for calibrating the same includes a external resistor connected to a first node, a plurality of calibration resistors connected to a second node, the plurality of calibration resistors being turned on/off in response to a calibration code set, a current mirror configured to mirror currents of the first node and the second node and a code generator configured to generate a calibration code set according to the mirrored currents. In accordance with a method for calibrating an on die termination circuit of the present invention, the method includes a step of mirroring a current of a first node connected to an external resistor and a current of a second node connected to a plurality of calibration resistors and a step of generating a calibration code set according to the mirrored currents.

15 Claims, 3 Drawing Sheets

U.S. PATENT DOCUMENTS

| | | | |
|---|---|---|---|
| 7,410,293 B1 * | 8/2008 | Santurkar et al. | 374/178 |
| 7,439,789 B2 * | 10/2008 | Nguyen | 327/308 |
| 2002/0063575 A1 * | 5/2002 | Kim et al. | 326/30 |
| 2003/0189441 A1 * | 10/2003 | Nguyen et al. | 326/30 |
| 2003/0218477 A1 * | 11/2003 | Jang et al. | 326/30 |
| 2004/0217774 A1 * | 11/2004 | Choe | 326/30 |
| 2007/0103189 A1 * | 5/2007 | Chang et al. | 326/30 |
| 2008/0048714 A1 * | 2/2008 | Lee et al. | 326/30 |

FOREIGN PATENT DOCUMENTS

| | | |
|---|---|---|
| JP | 2006-129423 | 5/2006 |
| KR | 10-2003-0090955 A | 12/2003 |
| KR | 10-2007-0035331 A | 3/2007 |
| KR | 10-2008-0018779 A | 2/2008 |

* cited by examiner

ON DIE TERMINATION CIRCUIT AND METHOD FOR CALIBRATING THE SAME

CROSS-REFERENCE TO RELATED APPLICATIONS

This application claims priority of Korean patent application number 10-2007-0046380, filed on May 14, 2007, which is incorporated by reference in its entirety.

BACKGROUND OF THE INVENTION

The subject matter relates to an on die termination (ODT) circuit used in a variety of semiconductor integrated circuits, and more particularly, to an ODT circuit with improved resolution.

Semiconductor circuits are implemented into integrated circuit (IC) chips such as central processing units (CPUs), memories, and gate arrays, and are incorporated into a variety of electrical products such as personal computers, servers, and workstations. Most semiconductor circuits include an input circuit configured to receive signals from outside the circuit via input pads and an output circuit configured to provide internal signals to outside the circuit via output pads.

As the operating speed of electrical products is increasing, a swing width of a signal exchanged between semiconductor circuits is being gradually reduced for minimizing a time taken for signal transmission. However, the reduction in the swing width of the signal has a great influence on an external noise, causing signal reflectivity to be more critical at an interface terminal due to impedance mismatch. Such impedance mismatch is generally caused by an external noise, a variation of a power supply voltage, a change in an operating temperature, a change in a manufacturing process, etc. The impedance mismatch may lead to a difficulty in high-speed data transmission and distortion of output data. If semiconductor circuits receive the distorted output signal through an input terminal, problems such as a setup/hold failure and an error in decision of an input level may frequently arise.

In order to resolve the above problems, a memory circuit requiring high-speed performance employs an impedance matching circuit, which is called an ODT circuit, near an input pad inside an IC chip. In a typical ODT scheme, source termination is performed at a transmitting end by an output circuit, and parallel termination is performed at a receiving end by a termination circuit connected in parallel to a receiving circuit coupled to the input pad.

ZQ calibration refers to a procedure of generating pull-up and pull-down codes which are varied with process, voltage and temperature (PVT) conditions. The resistance of the ODT circuit, e.g., a termination resistance at a DQ pad in a memory circuit, is calibrated using the code set resulting from the ZQ calibration. The ZQ calibration is named because the calibration is performed using a ZQ node.

The ZQ calibration in the ODT circuit will be described below.

FIG. 1 is a circuit diagram of a conventional calibration circuit of an ODT circuit for performing ZQ calibration.

Referring to FIG. 1, the conventional ODT circuit includes a first pull-up calibration resistance unit 110, a second pull-up calibration resistance unit 120, a dummy resistor 101 for pull-down calibration, a pull-down calibration resistance unit 130, a reference voltage generator 102, comparators 103 and 104, and counters 105 and 106 to perform the ZQ calibration.

The comparator 103 compares voltage level of the ZQ node and that of a reference voltage VREF to generate an up signal UP and a down signal DN. The voltage of the ZQ node is generated by connecting the first pull-up calibration resistance unit 110 and the external resistor 101 having a resistance of generally 240Ω. Here, the external resistor 101 is connected to a ZQ pin that is an external chip surface of the ZQ node. The reference voltage is generated by an internal reference voltage generator 102, and is generally set to VDDQ/2.

The pull-up counter 105 receives the up/down signals to generate binary pull-up calibration code set PCODE<0:N>. The generated binary pull-up calibration code set PCODE<0: N> turn on/off resistors connected in parallel in the first pull-up calibration resistance unit 110 to control a total resistance of the first pull-up calibration resistance unit 110. The controlled resistance of the first pull-up calibration resistance unit 110 is reflected again in the ZQ node voltage, and then the above-described operation is repeated. That is, the first pull-up calibration resistance unit 110 is calibrated such that a total resistance of the first pull-up calibration resistance unit 110 becomes identical to the resistance of the external resistor 101 of generally 240Ω (pull-up calibration).

The pull-up calibration code set PCODE<0:N>, that is binary codes generated by the above-described pull-up calibration, are input to the second pull-up calibration resistance unit 120 to determine total resistance of the second pull-up calibration resistance unit 120. Next, a pull-down calibration is performed using the comparator 104 and the pull-down counter 106 in a similar manner to the pull-up calibration. The pull-down calibration resistance unit 130 is calibrated so that a voltage of node A becomes identical to the reference voltage VREF. In other words, the pull-down calibration resistance unit 130 is calibrated so that a total resistance of the pull-down calibration resistance unit 130 becomes identical to the total resistance of the second pull-up calibration resistance unit 120 (pull-down calibration).

The binary codes PCODE<0:N> and NCODE<0:N> generated by the ZQ calibration (the pull-up calibration and the pull-down calibration) are input to pull-up and pull-down resistors (termination resistors) at the input/output pad sides. Then, the resistance of the ODT circuit, e.g., pull-up and pull-down resistance at a DQ pad side in a memory circuit, is determined. Here, the pull-up and pull-down resistors at the input/output pad sides have layouts identical to those of the pull-up and pull down calibration resistance units shown in FIG. 1.

FIG. 1 illustrates the case where both the pull-up and the pull-down calibrations are performed. Accordingly, both the pull-up calibration code set PCODE<0:N> and pull-down calibration code set NCODE<0:N> are generated to determine the total resistances of the pull-up and pull-down resistance units of the ODT circuit. However, the ODT circuits do not always have both the pull-up resistance unit and the pull-down resistance unit. For example, a semiconductor memory circuit has both the pull-up resistance unit and the pull-down resistance unit at an output driver side, however, it has only the pull-up resistance unit at an input buffer side.

When the ODT circuit has only the pull-up resistance unit at the input/output pad side, the calibration circuit of FIG. 1 also has only the pull-up calibration resistance unit 110 for generating the pull-up calibration code set PCODE<0:N>, the counter 105, and the comparator 105. The operation thereof is identical to the above-described pull-up calibration.

In the conventional calibration circuit of the ODT circuit, the ZQ node is directly connected to the comparator 103, which includes a differential amplifier. Because the voltage of the ZQ node may vary significantly according to the calibration code set PCODE<0:N>, a noise may be generated and input to the comparator 103.

In addition, because the external resistor 101 connected to the ZQ pin is connected from an outside of the system to which the ODT circuit is provided, this has the same effect as a capacitor of a great capacitance connected to the external resistor, as shown in FIG. 1 (system board capacitance). Therefore, it takes considerable time to stabilize the voltage of the ZQ pin.

The calibration circuit may always be kept in enabled state to stabilize the voltage of the ZQ pin. However, in such a case, a resistance of 480Ω, including the external resistance of 240Ω and the calibration resistance of 240Ω, always exists between the source voltage VDDQ and the ground voltage VSSQ, which may significantly increase the current consumption.

SUMMARY OF THE INVENTION

Embodiments of the present invention are directed to providing an ODT circuit that can reduce noise and current consumption caused by a direct use of a ZQ node voltage for generating a calibration code set.

In accordance with an aspect of the present invention, there is provided a first node for connecting an external resistor, a plurality of calibration resistors connected to a second node, each calibration resistor being turned on or off in response to a code included in a calibration code set, a current mirror configured to mirror currents of the first node and the second node, and a code generator configured to generate the calibration code set according to the mirrored currents.

In accordance with a method for calibrating an on die termination circuit of the present invention, the method includes a step of mirroring a current of a first node connected to an external resistor and a current of a second node connected to a plurality of calibration resistors with a total resistance responsive to a calibration code set, and a step of generating the calibration code set according to the mirrored currents.

DESCRIPTION OF SPECIFIC EMBODIMENTS

Hereinafter, an on die termination (ODT) circuit and a method for calibrating the ODT circuit in accordance with the present invention will be described in detail with reference to the accompanying drawings.

Figure 2:
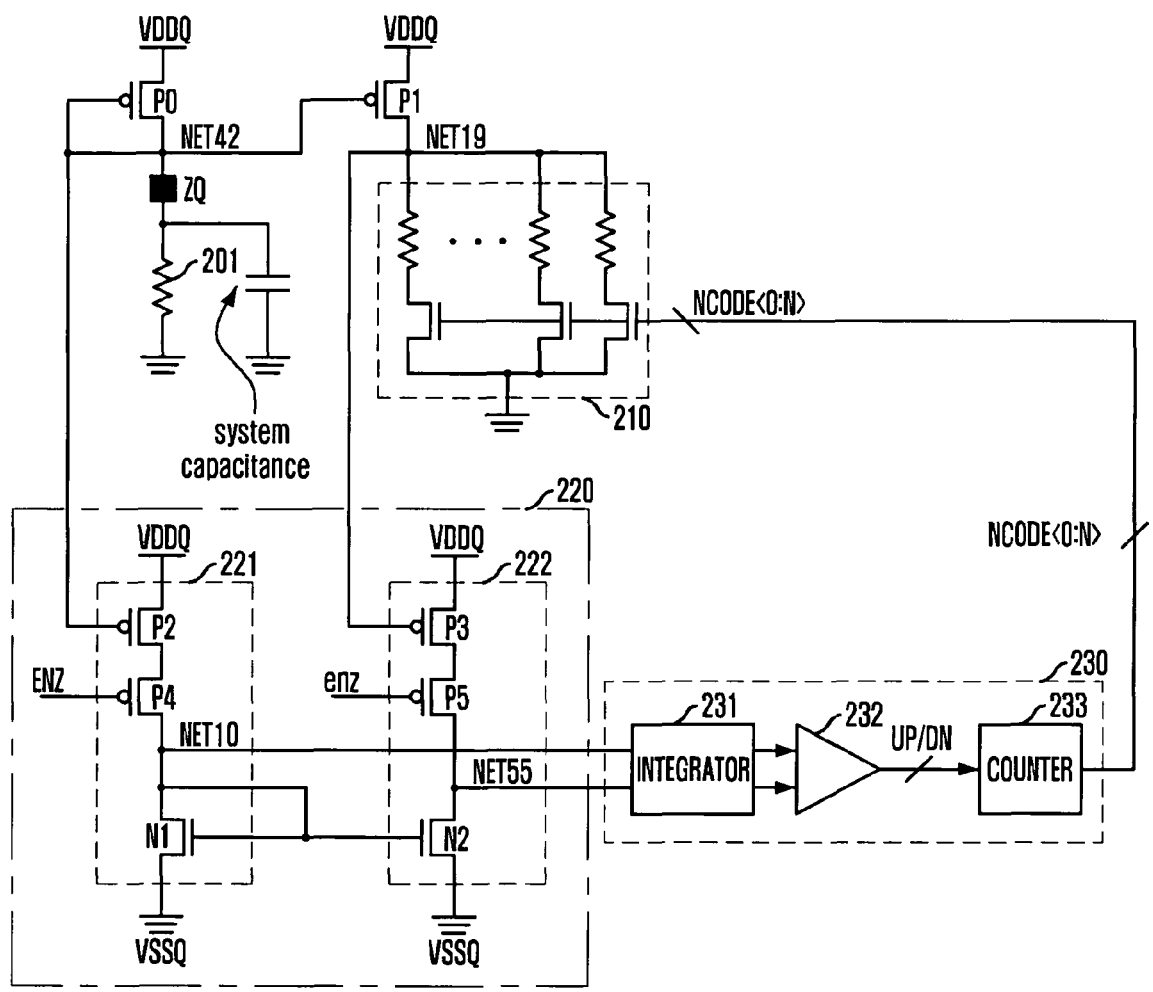
FIG. 2 is a circuit diagram illustrating a pull-down calibration circuit of an ODT circuit for generating a pull-down calibration code set in accordance with an embodiment of the present invention.

FIG. 2 is a circuit diagram of a calibration circuit of an ODT circuit for generating a calibration code set in accordance with an embodiment of the present invention.

A calibration circuit of the ODT circuit for generating only one calibration code set is illustrated in FIG. 2. In some cases, an ODT circuit requires only one calibration code set. Even in other cases where two calibration code sets are required, a first calibration code set is primarily generated through a comparison with an external resistor, and then a second calibration code set is generated using the first calibration code set. Therefore, it is important to generate the first calibration code set using the external resistor connected to the ZQ pin (node).

Referring to FIG. 2, the ODT circuit includes an external resistor 201, a plurality of calibration resistors 210, a current mirror 220, and a code generator 230 to perform a calibration. The external resistor 201 is connected to a first node ZQ. The plurality of calibration resistors 210 are connected to a second node NET19 and turned on/off in response to calibration code set NCODE<0:N>. The current mirror 220 mirrors currents of the first node ZQ and the second node NET19. The code generator 230 generates calibration code set NCODE<0:N> according to the mirrored currents of the first and second nodes, i.e., currents at nodes NET10 and NET55, received from the current mirror 220.

The current mirror 220 includes a first current mirror 221 for mirroring current of the first node ZQ and a second current mirror 222 for mirroring current of the second node NET19. In more detail, the first current mirror 221 includes a PMOS transistor P2 to mirror the current at the first node ZQ. Here, the PMOS transistor P2 is enabled in response to a voltage of at the first node ZQ. The second mirror 222 includes a PMOS transistor P3 to mirror the current at the second node NET19. Here, the PMOS transistor P3 is enabled in response to a voltage of at the second node NET19. The ODT circuit further includes a PMOS transistor P0 and a PMOS transistor P1 to mirror the currents of the first and second nodes ZQ and NET19 to the first and second current mirrors 221 and 222. The PMOS transistor P0 is connected to the first node ZQ and is enabled in response to the voltage of the first node ZQ. The PMOS transistor P1 is connected to the second node NET19 and is enabled in response to the voltage of the first node ZQ.

The code generator 230 generates codes according to the mirrored currents, which are currents of the first and second nodes mirrored by the current mirror 220, as described above. In more detail, the current mirror 220 generates calibration code set NCODE<0:N> according to a first voltage, i.e., a voltage of a node NET10 and a second voltage, i.e., a voltage of at a node NET55. The first voltage is varied according to a current of the first current mirror 221, and the second voltage is varied according to a current of the second current mirror 222. That is, the code generator generates codes according to voltages including the first voltage of the node NET10 and the second voltage of the node NET55. However, the voltages are determined by the currents of the first current mirror 211 and the second current mirror 222.

The code generator 230 may include a comparator 232 and a counter 233. The comparator 232 compares the first voltage of the node NET10 and the second voltage of at the node NET55 to output up/down signals UP and DN. The counter 233 increases or decreases the value of the calibration code set NCODE<0:N> in response to the up/down signals UP and DN. The comparator 233 may receive the first voltage of the node NET10 and the second voltage of the node NET55 via an integrator 231, as shown in FIG. 2. The integrator 231 integrates the first voltage of the node NET10 and the second voltage of the node NET55 for a predetermined duration. By this, the integrator 231 can filter the noise once more.

An operation of the ODT circuit will be described below. The calibration is performed basically by comparing the total resistance of the calibration resistors 210 with the resistance of the external resistor 201 and then adjusting the code set NCODE<0:N> according to the comparison result. In contrast to the conventional ODT circuit comparing the voltage of the ZQ node with the reference voltage, the ODT circuit in accordance with the instant embodiment compares the current of the second node NET19 with the current of the first node ZQ to compare the total resistance of the calibration resistors 210 with the resistance of the external resistor 201. This is because the currents at the first node ZQ and the second node NET19 are respectively determined by the resistances of the external resistor 201 and the calibration resistors 210.

The PMOS transistor P0 and the PMOS transistor P1 have the same size and shape. Accordingly, if the total resistance of the plurality of calibration resistors 210 connected in parallel is identical to the resistance of the external resistor 201, the current flowing through the first node ZQ is identical to the current flowing through the second node NET19. Further, the PMOS transistor P2 and the PMOS transistor P3 have the same size and shape, and the PMOS transistor P4 and the PMOS transistor P5 also have the same size and shape. Accordingly, if the current flowing through the first node ZQ is identical to the current flowing through the second node NET19, the current flowing through the node NET10 is also identical to the current flowing through the node NET55. In addition, the NMOS transistor N1 and the NMOS transistor N2 have the same size and shape. Accordingly, if the current flowing through the node NET10 is identical to the current flowing through the node NET55, the node NET10 and the node NET55 have the same voltage level. That is, the currents flowing through the first node ZQ and the second node NET19 are mirrored to the first current mirror 221 and the second current mirror 222, and thus affect the voltage levels of the first voltage of the node NET10 and the second voltage of the node NET55, respectively.

If the total resistance of the plurality of parallel resistors 210 connected in parallel is different from the resistance of the external resistor 201, the current flowing through the first node ZQ is different from the current flowing through the second node NET19. These currents are mirrored to the first current mirror 221 and the second current mirror 222 so that the node NET10 and the node NET55 have different voltage levels. That is, the comparison of the total resistance of the plurality of parallel resistors 210 connected in parallel and the resistance of the external resistor 201 may be performed indirectly by comparing the first voltage of the node NET10 and the second voltage of the node NET55. As such, the calibration code set NCODE<0:N> can be adjusted to turn on/off the plurality of calibration resistors 210 so that the plurality of calibration resistors 210 can be calibrated to have the same resistance as the external resistor 201. Such calibration code set NCODE<0:N> serves as a final calibration code set.

Figure 1:
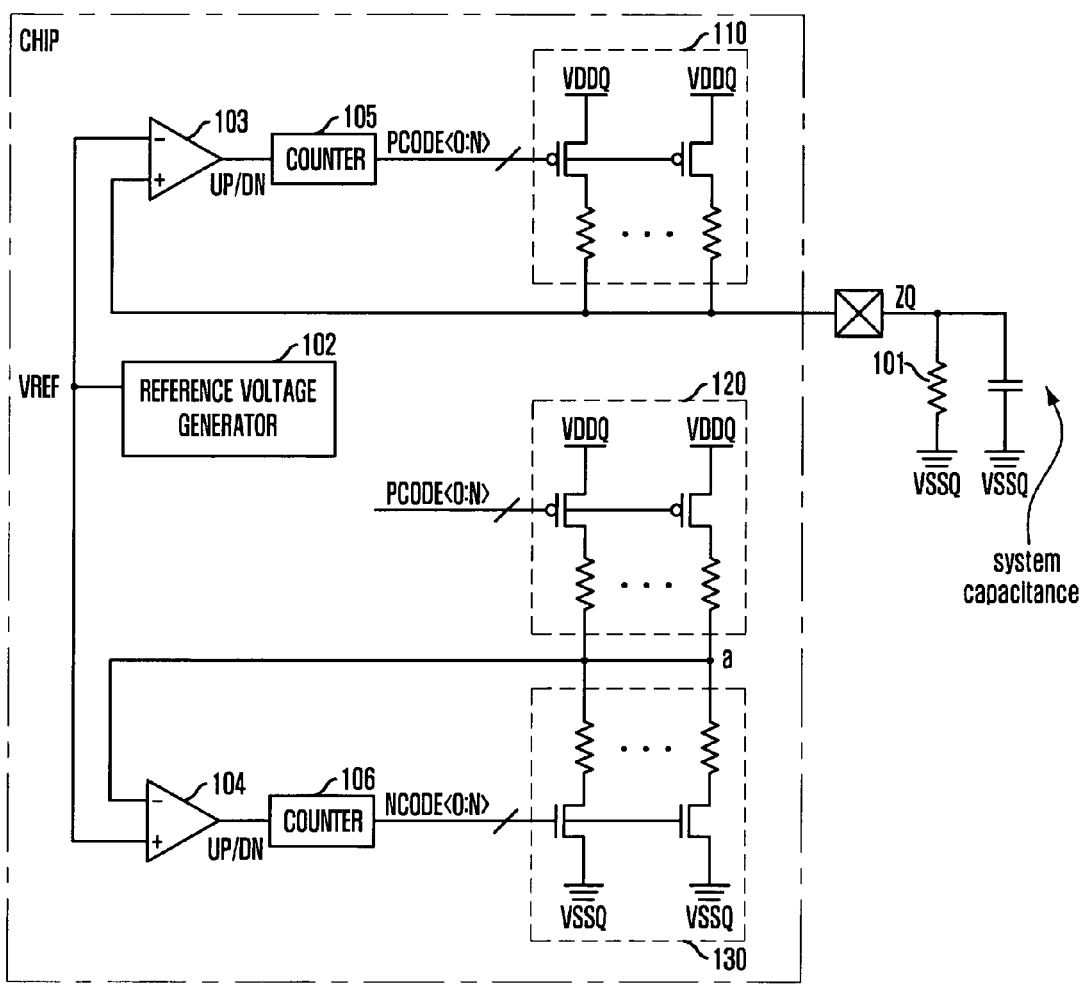
FIG. 1 is a circuit diagram of a conventional calibration circuit of an ODT circuit for performing ZQ calibration.

Because the ODT circuit in accordance with the embodiment does not directly use the voltage of the first node ZQ to generate the calibration code set NCODE<0:N>, it is possible to reduce a influence of noise caused by a sudden variation of the voltage of the first node ZQ. The influence of noise may be substantially reduced by adding the integrator 231. In addition, contrary to the ZQ node described above with reference to FIG. 1, the pull-up calibration circuit does not have the effect as if a system capacitor is connected thereto. Therefore, it is advantageous to keep the circuit at the external resistor 201 side in enabled state for a rapid operation. In the calibration circuit in accordance with the embodiment, less current flows through the first node ZQ and the second node NET19 than in the conventional calibration circuit because the PMOS transistors are not fully turned on. Therefore, even if the circuits at the first node ZQ side and the second node NET19 side are always enabled, it is possible to lower the current consumption. Additionally, by activating a signal ENZ to a logic low state only in a calibration mode and keeping the circuits at the first node ZQ side and the second node NET19 side always enabled, the calibration circuit can perform a high speed operation with a much lower current consumption than the conventional calibration circuit.

FIG. 2 illustrates a pull-down calibration circuit for generating pull-down calibration code set NCODE<0:N> through indirect comparison between the resistance of the external resistor 201 and the total resistance of the calibration resistors 210. After generating the pull-down calibration code set NCODE<0:N>, the pull-up calibration code set PCODE<0:N> may be generated using the pull-up calibration circuit of FIG. 3. Alternatively, it is also possible to generate the pull-up calibration code set PCODE<0:N> prior to the generation of the pull-down calibration code set NCODE<0:N>. This can be realized by implementing the external resistor 201 with a pull-up resistor instead of the pull-down resistor, and implementing the calibration resistors 210 with pull-up resistors instead of the pull-down resistors. Such a modification in the design can be easily made therefrom by those skilled in the art, and thus a detailed description thereof will be omitted herein.

Figure 3:
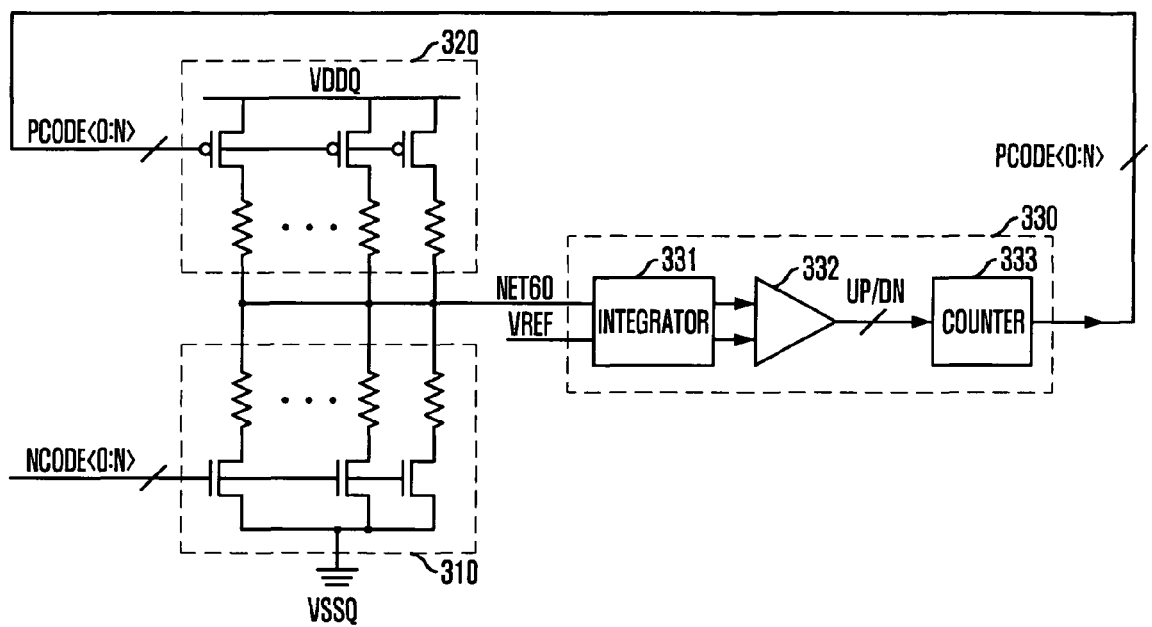
FIG. 3 is a circuit diagram illustrating a pull-up calibration circuit of an ODT circuit for generating a pull-up calibration code set based on the pull-down calibration code set generated by the pull-down calibration circuit illustrated in FIG. 2 in accordance with an embodiment of the present invention.

FIG. 3 is a circuit diagram of a pull-up calibration circuit of an ODT circuit for generating a pull-up calibration code set based on the pull-down calibration code set generated by the pull-down calibration circuit of FIG. 2 in accordance with an embodiment of the present invention.

The method for generating the pull-up calibration code set is similar to the conventional method for generating a pull-down calibration code set, discussed previously. Referring to FIG. 3, a plurality of pull-down calibration resistors 310 and a plurality of pull-up calibration resistors 320 are connected to a third node NET60. The pull-down calibration resistors 310 have the same configuration as the pull-down calibration resistors 210 in FIG. 2. The pull-up calibration resistors 320 are turned on/off in response to pull-up calibration code set PCODE<0:N>. A voltage of the third node NET60 is compared with the reference voltage VREF (½VDDQ) and then the pull-up calibration code set PCODE<0:N> are adjusted according to the comparison result. The pull-up calibration code set PCODE<0:N> are adjusted until a total resistance of the pull-up calibration resistors 320 becomes identical to a total resistance of the pull-down calibration resistors 310.

The pull-up calibration circuit further includes a code generator 330 for adjusting the pull-up calibration code set PCODE<0:N>. The pull-up calibration circuit may include an integrator 331, a comparator 332 and a counter 333. The integrator 331 can filter noise, as described above with reference to FIG. 2.

FIG. 3 illustrates a case where the pull-up calibration code set PCODE<0:N> is generated by directly comparing voltage of a third node NET60 with the reference voltage VREF. The pull-up calibration circuit generates less noise than the pull-down calibration circuit because it generates the pull-up calibration code set PCODE<0:N> based on the pull-down calibration code set NCODE<0:N> generated by the pull-down calibration circuit of FIG. 2. Furthermore, contrary to the pull-down calibration circuit, the pull-up calibration circuit does not have the effect as if a system capacitor is connected thereto. Therefore, the pull-up calibration circuit can operate stably even without providing the integrator 331 thereto. However, it is also possible to generate the pull-up calibration code set PCODE<0:N> by an indirect comparison through a current mirror as described above with reference to FIG. 2.

Hereinafter, a method for calibrating an ODT circuit in accordance with an embodiment of the present invention will be described with reference to FIG. 2.

The method for calibrating the ODT circuit includes mirroring a current of a first node ZQ connected to an external resistor 201 and a current of a second node NET19 connected to a plurality of calibration resistors 210, and generating calibration code set NCODE<0:N> according to the mirrored currents of the first and second nodes ZQ and NET19, i.e., currents of the nodes NET10 and NET55.

In more detail, the generating of the calibration code set NCODE<0:N> includes comparing voltages generated by the mirrored currents of the first and second nodes ZQ and NET19, i.e., voltages of the nodes NET10 and NET55, and adjusting the calibration code set NCODE<0:N> according to the comparison result.

The voltages generated by the mirrored currents of the first and second nodes ZQ and NET19, i.e., voltages of the nodes NET10 and NET55 may be integrated prior to comparing the voltages.

In the case where the generated calibration code set is pull-down calibration code set NCODE<0:N>, the method may further include generating pull-up calibration code set PCODE<0:N> according to the generated pull-down calibration code set NCODE<0:N>.

As described above, the ODT circuit generates a calibration code set through the indirect comparison with the ZQ node voltage using a current mirror, instead of the direct comparison with the ZQ node voltage. Therefore, it is possible to reduce noise caused by the direct use of the ZQ node voltage.

Further, the reduced power consumption of the ZQ node side makes it possible to keep the ZQ node side enabled for a rapid operation of the ODT circuit without significant power consumption.

Additionally, the integrator provided to the code generator can reduce the noise further.

While the present invention has been described with respect to the specific embodiments, it will be apparent to those skilled in the art that various changes and modifications may be made without departing from the spirit and scope of the invention as defined in the following claims.

What is claimed is:

1. An on die termination circuit, comprising:
    a first current source configured to generate a first current at a first node;
    a second current source configured to generate a second current at a second node coupled to a plurality of calibration resistors, each calibration resistor being turned on or off in response to a code included in a calibration code set;
    a current mirror configured to generate third and fourth currents by mirroring the first and second currents in response to voltages of the first and second nodes for a calibration mode, wherein the generated third and fourth currents are supplied to a third node and a fourth node; and
    a code generator configured to generate the calibration code set according to the third current of the third node and the fourth current of the fourth node.

2. The on die termination circuit as recited in claim 1, wherein the current mirror comprises:
    a first current mirror configured to mirror the first current; and
    a second current mirror configured to mirror the second current.

3. The on die termination circuit as recited in claim 2, wherein the code generator comprises an integrator configured to integrate the third and fourth currents and output a first voltage and a second voltage.

4. The on die termination circuit as recited in claim 3, wherein the code generator further comprises:
    a comparator configured to compare the first and second voltages to output up and down signals; and
    a counter configured to adjust the calibration code set according to the up and down signals.

5. The on die termination circuit as recited in claim 2, wherein the first current mirror comprises a first PMOS transistor to mirror the first current, the first PMOS transistor being enabled in response to a voltage of the first node.

6. The on die termination circuit as recited in claim 5, wherein the second current mirror comprises a second PMOS transistor to mirror the second current, the second PMOS transistor being enabled in response to a voltage of the second node.

7. The on die termination circuit as recited in claim 6, wherein the first current source includes a third PMOS transistor connected to the first node and receiving the voltage of the first node through a gate.

8. The on die termination circuit as recited in claim 6, wherein the current mirror is enabled in response to an enable signal which is activated for the calibration mode.

9. The on die termination circuit as recited in claim 6, wherein the second current source includes a fourth PMOS transistor connected to the second node and receiving the voltage of the first node through a gate, so that the first and second currents are mirrored to the first and second current mirrors, respectively.

10. The on die termination circuit as recited in claim 1, wherein the plurality of calibration resistors are a plurality of pull-down calibration resistors, the calibration code set is a pull-down calibration code set, and the on die termination circuit further comprises:
    a plurality of dummy pull-down calibration resistors having the same configurations as the plurality of pull-down calibration resistors have; and
    a plurality of pull-up calibration resistors calibrated against the plurality of dummy pull-down calibration resistors to generate a pull-up calibration code set.

11. The on die termination circuit as recited in claim 1, wherein the first node is a ZQ node and for connecting an external resistor.

12. A method for calibrating an on die termination circuit, the method comprising:
    generating first and second currents in response to voltages of a first node coupled to an external resistor and a second node coupled to a plurality of calibration resistors with a total resistance responsive to a calibration code set;
    mirroring the first and the second currents to generate a third current and a fourth current for a calibration mode, wherein the generated third and fourth currents are supplied to a third node and a fourth node; and
    generating the calibration code set according to the third current of the third node and the fourth current of the fourth node.

13. The method as recited in claim 12, wherein the generation of the calibration code set comprises:
    comparing the third and fourth currents; and
    adjusting the value of the calibration code set according to the comparison result.

14. The method as recited in claim 13, wherein the comparing of the voltages comprises:

integrating each of the third and fourth currents and generating a first voltage and a second voltage; and comparing the first and second voltages.

15. The method as recited in claim 12, wherein the plurality of calibration resistors are a plurality of pull-down calibration resistors, the calibration code set is a pull-down calibration code set, and the method further comprises generating a pull-up calibration code set by using the generated pull-down calibration code set.

\* \* \* \* \*